(12) United States Patent
Michiwaki

(10) Patent No.: US 10,537,021 B2
(45) Date of Patent: Jan. 14, 2020

(54) THREE-DIMENSIONAL WIRING BOARD PRODUCTION METHOD, THREE-DIMENSIONAL WIRING BOARD, AND SUBSTRATE FOR THREE-DIMENSIONAL WIRING BOARD

(71) Applicant: MEIKO ELECTRONICS CO., LTD., Ayase-shi, Kanagawa (JP)

(72) Inventor: Shigeru Michiwaki, Ayase (JP)

(73) Assignee: MEIKO ELECTRONICS CO., LTD., Kanagawa (JP)

( * ) Notice: Subject to any disclaimer, the term of this patent is extended or adjusted under 35 U.S.C. 154(b) by 0 days.

(21) Appl. No.: 16/229,948

(22) Filed: Dec. 21, 2018

(65) Prior Publication Data

US 2019/0124763 A1    Apr. 25, 2019

Related U.S. Application Data

(62) Division of application No. 15/578,484, filed as application No. PCT/JP2015/080796 on Oct. 30, 2015, now Pat. No. 10,244,624.

(30) Foreign Application Priority Data

Jun. 24, 2015   (WO) .................. PCT/JP2015/068230

(51) Int. Cl.
*H05K 1/02*     (2006.01)
*H05K 1/09*     (2006.01)
(Continued)

(52) U.S. Cl.
CPC ......... *H05K 1/0284* (2013.01); *H05K 1/0326* (2013.01); *H05K 1/09* (2013.01);
(Continued)

(58) Field of Classification Search
CPC ...... H05K 1/0284; H05K 1/09; H05K 3/0014; H05K 3/181; H05K 3/426
See application file for complete search history.

(56) References Cited

U.S. PATENT DOCUMENTS 3,884,771 A    5/1975   Hanabusa
4,164,005 A    8/1979   Cheseldine
(Continued)

FOREIGN PATENT DOCUMENTS

DE    10-2006-007397 B3    4/2007
JP        06-188537 A        7/1994
(Continued)

*Primary Examiner* — Hoa C Nguyen
(74) *Attorney, Agent, or Firm* — Volpe and Koenig, P.C.

(57) ABSTRACT

A three-dimensional wiring board production method is provided that includes: a preparation step of preparing a resin film (1) having a breaking elongation of 50% or more; a first metal film formation step of forming a first metal film (3) on a surface of the resin film; a pattern formation step of performing patterning on the first metal film to form a desired pattern; a three-dimensional molding step of performing three-dimensional molding by heating and pressurizing the resin film; and a second metal film formation step of forming a second metal film (21) on the first metal film having a pattern formed thereon. In the first metal film formation step, metal is deposited in a particle state to form the first metal film in a porous state.

10 Claims, 9 Drawing Sheets

(51) Int. Cl.
  *H05K 3/00* (2006.01)
  *H05K 3/42* (2006.01)
  *H05K 1/03* (2006.01)
  *H05K 3/14* (2006.01)
  *H05K 3/18* (2006.01)
  *H05K 3/38* (2006.01)

(52) U.S. Cl.
  CPC ......... *H05K 3/0014* (2013.01); *H05K 3/0023* (2013.01); *H05K 3/14* (2013.01); *H05K 3/426* (2013.01); *H05K 3/181* (2013.01); *H05K 3/389* (2013.01); *H05K 2201/0129* (2013.01); *H05K 2201/0338* (2013.01); *H05K 2201/0341* (2013.01); *H05K 2201/0347* (2013.01); *H05K 2201/09118* (2013.01); *H05K 2203/072* (2013.01); *H05K 2203/124* (2013.01); *H05K 2203/1461* (2013.01)

(56) References Cited

U.S. PATENT DOCUMENTS

| | | | |
|---|---|---|---|
| 4,248,921 A * | 2/1981 | Steigerwald | B23K 35/001 |
| | | | 174/257 |
| 5,112,726 A | 5/1992 | Cohen et al. | |
| 5,623,127 A | 4/1997 | Bradley et al. | |
| 6,819,540 B2 | 11/2004 | Allen et al. | |
| 8,231,928 B2 | 7/2012 | Dambrowsky et al. | |
| 2003/0150109 A1 | 8/2003 | Magoi | |
| 2004/0191497 A1* | 9/2004 | Hiraoka | H01L 23/145 |
| | | | 428/304.4 |
| 2008/0145607 A1 | 6/2008 | Kajiwara et al. | |
| 2013/0056050 A1 | 3/2013 | Kawazoe et al. | |
| 2013/0177770 A1 | 7/2013 | Mori et al. | |
| 2015/0131009 A1* | 5/2015 | Degiovine | G06F 1/1637 |
| | | | 349/12 |
| 2015/0310967 A1* | 10/2015 | Spath | H05K 3/4644 |
| | | | 427/125 |

FOREIGN PATENT DOCUMENTS

| | | |
|---|---|---|
| JP | 11-121880 A | 4/1999 |
| JP | 2000-174399 A | 6/2000 |
| JP | 2012-094605 A | 5/2012 |
| JP | 2013-146870 A | 8/2013 |
| KR | 1020150058097 A | 5/2015 |
| TW | 2014-48698 A | 12/2014 |
| TW | 2015-22071 A | 6/2015 |
| WO | 2013/132930 A1 | 9/2013 |
| WO | 2014/168220 A1 | 10/2014 |
| WO | 2014-168220 A1 | 10/2014 |
| WO | 2015/037511 A1 | 3/2015 |
| WO | 2015-037511 A1 | 3/2015 |

* cited by examiner

US 10,537,021 B2

THREE-DIMENSIONAL WIRING BOARD PRODUCTION METHOD, THREE-DIMENSIONAL WIRING BOARD, AND SUBSTRATE FOR THREE-DIMENSIONAL WIRING BOARD

This application is a continuation of U.S. patent application Ser. No. 15/578,484, filed on Nov. 30, 2017, which claims priority to PCT/JP2015/068230 filed on Jun. 24, 2015 which is a national stage entry of PCT/JP2015/080796 filed on Oct. 30, 2015, which is incorporated by reference as if fully set forth.

DESCRIPTION

Technical Field

The present invention relates to a method for producing a three-dimensional wiring board that is three-dimensionally molded, a three-dimensional wiring board produced by the production method, and a substrate for a three-dimensional wiring board that is used in the three-dimensional wiring board.

Background Art

The conventionally known three-dimensional wiring boards include an MID (Molded Interconnect Device) substrate that is a component in which an electric circuit is directly and three-dimensionally formed on a surface of a structural body having a three-dimensional structure. Processes such as the two shot molding process, MIPTEC (Microscopic Integrated Processing Technology), and LDS (Laser Direct Structuring) are known as technology that relates to MID substrates. In each of these processes, after forming mold resin into a three-dimensional structure, a wiring circuit is formed on a surface thereof. For example, in Patent Document 1, technology relating to an MID substrate and the production thereof is disclosed.

In the two shot molding process, secondary molding is performed using new resin with respect to a portion which is not subjected to wiring formation on mold resin that underwent primary molding, and catalyst application and plating is then performed using the resin relating to the secondary molding as a resist to thereby form a wiring circuit on the mold resin. However, because of limitations to the mold machining precision for the secondary molding in order to regulate a wiring pattern shape by means of the resin that is subjected to the secondary molding, the minimum value for L/S (line width and spacing) that indicates the conductor width and conductor spacing is of the order of 150/150 μm, and formation of a finer wiring pattern has been difficult.

In MIPTEC, metallizing is performed with respect to the entire surface of the mold resin that was molded, and metal (a metallized layer) at an outer edge portion of the wiring circuit is removed by means of a laser beam. Subsequently, electroplating is performed by passing an electric current through a region that is to serve as a wiring circuit, and thereafter flash etching is performed with respect to the whole area of the molded body to remove metal other than the wiring circuit and thereby form the wiring circuit on the mold resin. However, in the case of using a laser beam, a special laser irradiation apparatus that corresponds to the three-dimensional shape of the mold resin that was molded is required, and the time and labor required for laser machining as well as an increase in the production cost that is caused by investment in plant and machinery is a problem. Further, since it is necessary to pass a current through only a region that is to serve as a wiring circuit in order to deposit metal that is required for the wiring circuit by electroplating, it is necessary for the region that is to serve as the wiring circuit to be electrically connected to an outer circumferential portion of the molded body or to be electrically connected to the outer circumferential portion through a power feeder line. That is, the problems arise that it is difficult to electrically isolate the region that serves as the wiring circuit from the outer circumferential portion of the molded body (that is, to form an independent wiring pattern), and that the costs increase accompanying formation and removal of a power feeder line that is ultimately not required for the circuit.

In LDS, a wiring circuit is formed on mold resin by performing primary molding using a special resin material that contains conductive particles, irradiating a laser beam onto a region that is to serve as a wiring circuit to expose the conductive particles, and performing plating at a portion at which the conductive particles are exposed. However, because of a problem regarding the accuracy with which conductive particles within the mold resin that was molded are exposed, the minimum value of the L/S is of the order of 100/150 μm, and formation of a finer wiring pattern has been difficult. Further, similarly to MIPTEC, a special laser irradiation apparatus is required, and the time and labor required for laser machining as well as an increase in the production cost that is caused by investment in plant and machinery are problems.

Further, in each of the above described processes, because a wiring circuit is formed on mold resin having a three-dimensional shape, the MID substrate that is ultimately produced is a single-sided substrate. Therefore, the problem arises that the degree of freedom with respect to the wiring circuit is less when compared to a double-sided substrate, and miniaturization of the substrate is also difficult. As a method for solving this problem and the problems described above, a method of producing a three-dimensional wiring board is available in which a wiring circuit is formed on thermoplastic resin such as polyimide, and thereafter the resin is subjected to bending work by heating and pressurization. For example, Patent Document 2 discusses performing three-dimensional molding after a metal foil is attached onto a polyimide film by thermocompression bonding, and Patent Document 3 discusses performing three-dimensional molding after applying a conductive paste onto polysulfone resin.

PRIOR ART DOCUMENT

Patent Document

Patent Document 1: Japanese Patent Laid-Open No. 2012-94605
Patent Document 2: Japanese Patent Laid-Open No. 6-188537
Patent Document 3: Japanese Patent Laid-Open No. 2000-174399

SUMMARY OF THE INVENTION

Problems to be Solved by the Invention

However, when it is attempted to bend and three-dimensionally mold thermoplastic resin that is flat by performing heating and pressurization, stretching occurs that is centered around a bent portion. At such time, although on one hand most thermoplastic resins have a large breaking elongation and stretch comparatively freely, on the other hand even though the metal which was subjected to pattern formation stretches to a certain limit, if the metal stretches beyond the limit a countless numbers of cracks that have a wide width are generated and the metal breaks. For example, if three-dimensional molding is performed after forming metal to serve as a wiring circuit on resin by a method as described in Patent Document 2 and Patent Document 3, disconnection of a wire in the wiring circuit is liable to occur at a curved portion of the three-dimensional wiring board, and consequently it is difficult to produce a three-dimensional wiring board that has excellent reliability. In particular, in a case of molding a three-dimensional substrate having a complicated three-dimensional shape with respect to which the amount of stretching is large, the disconnection of a wire in a wiring circuit is even more liable to occur.

The present invention has been made to solve the above described problems, and an object of the present invention is to provide a production method that achieves fine patterning of a wiring circuit and a reduction in cost, and enables production of a three-dimensional wiring board that prevents disconnection of wires in a wiring circuits and thus has excellent reliability. Further, the present invention has been made to solve the above described problems, and an object thereof is to provide a three-dimensional wiring board with respect to which fine patterning of a wiring circuit and a reduction in cost are achieved, and on which a wiring circuit is formed on one side or two sides thereof and which prevents disconnection of wires in a wiring circuits and thus has excellent reliability, as well as a substrate for a three-dimensional wiring board that is used in the three-dimensional wiring board.

Means for Solving the Problems

In order to achieve the above object, a three-dimensional wiring board production method of the present invention includes: a preparation step of preparing a resin film having a breaking elongation of 50% or more; a first metal film formation step of forming a first metal film on a surface of the resin film; a pattern formation step of performing patterning on the first metal film by photolithography to form a desired pattern; a three-dimensional molding step of performing three-dimensional molding by heating and pressurizing the resin film; and a second metal film formation step of forming a second metal film on the first metal film having a pattern formed thereon; wherein, in the first metal film formation step, the first metal film is formed in a porous state by depositing a metal in a particle state and regulating a film thickness.

Further, in order to achieve the above object, a three-dimensional wiring board of the present invention includes: a resin film having a three-dimensional shape and having a breaking elongation of 50% or more; a first metal film that is formed on a surface of the resin film and that has a desired pattern; and a second metal film that is formed on the first metal film; wherein a film thickness of the first metal film is regulated so that the first metal film is a porous-like structure that is formed by depositing a metal in a particle state.

In addition, in order to achieve the above object, a substrate for a three-dimensional wiring board of the present invention includes: a resin film having a breaking elongation of 50% or more; and a first metal film that is formed on a surface of the resin film and that has a desired pattern; wherein a film thickness of the first metal film is regulated so that the first metal film is a porous-like structure that is formed by depositing a metal in a particle state.

Advantageous Effects of the Invention

According to the present invention, a production method can be provided that achieves fine patterning of a wiring circuit and a reduction in cost, and enables production of a three-dimensional wiring board that prevents disconnection of wires in a wiring circuit and thus has excellent reliability. Further, according to the present invention, there can be provided a three-dimensional wiring board with respect to which fine patterning of a wiring circuit and a reduction in cost are achieved, and that prevents disconnection of wires in a wiring circuit and thus has excellent reliability, as well as a substrate for a three-dimensional wiring board that is required for producing the three-dimensional wiring board.

MODE FOR CARRYING OUT THE INVENTION

Hereunder, with reference to the accompanying drawings, a mode for carrying out the present invention is described in detail based on an example. Note that the present invention is not limited to the contents described below and can be optionally modified and implemented within a range that does not depart from the gist of the present invention. Further, the respective drawings that are used for the description of the example schematically illustrate a three-dimensional wiring board as well as constituent members thereof according to the present invention, and in some cases, to deepen understanding of the present invention, the three-dimensional wiring board and the constituent members thereof are partially emphasized, enlarged, reduced, or omitted or the like, and thus the drawings do not exactly represent the scale or shape or the like of the three-dimensional wiring board and the constituent members thereof. In addition, various numerical values used in the example are sometimes exemplary and can be modified in various ways as necessary.

Example

Figure 3:
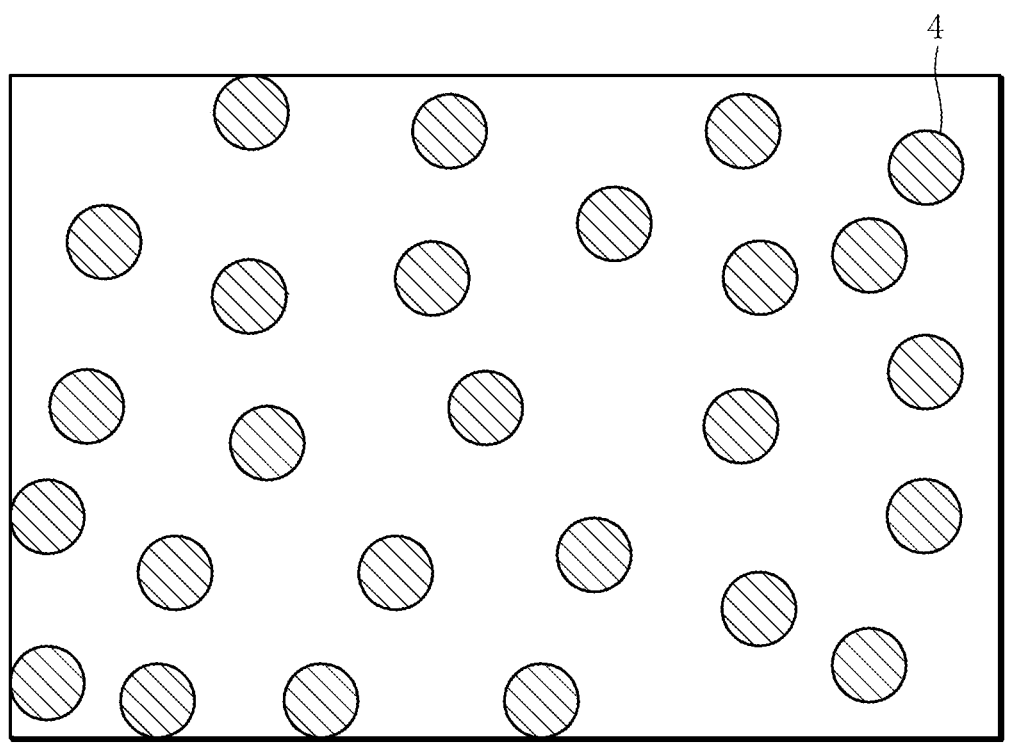
FIG. 3 is a schematic diagram illustrating a state during metal film formation with respect to the three-dimensional wiring board according to the example of the present invention.
Figure 4:
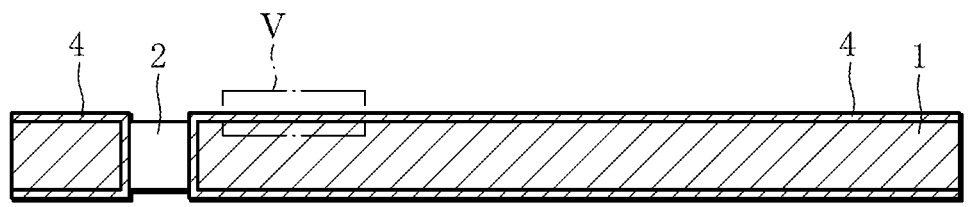
FIG. 4 is a cross-sectional view illustrating a state during a process for producing the three-dimensional wiring board according to the example of the present invention.
Figure 5:
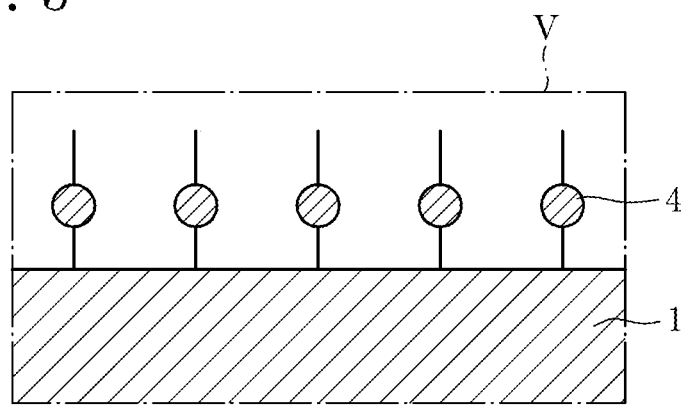
FIG. 5 is an enlarged conceptual diagram of a dashed-line region V in FIG. 4.
Figure 8:
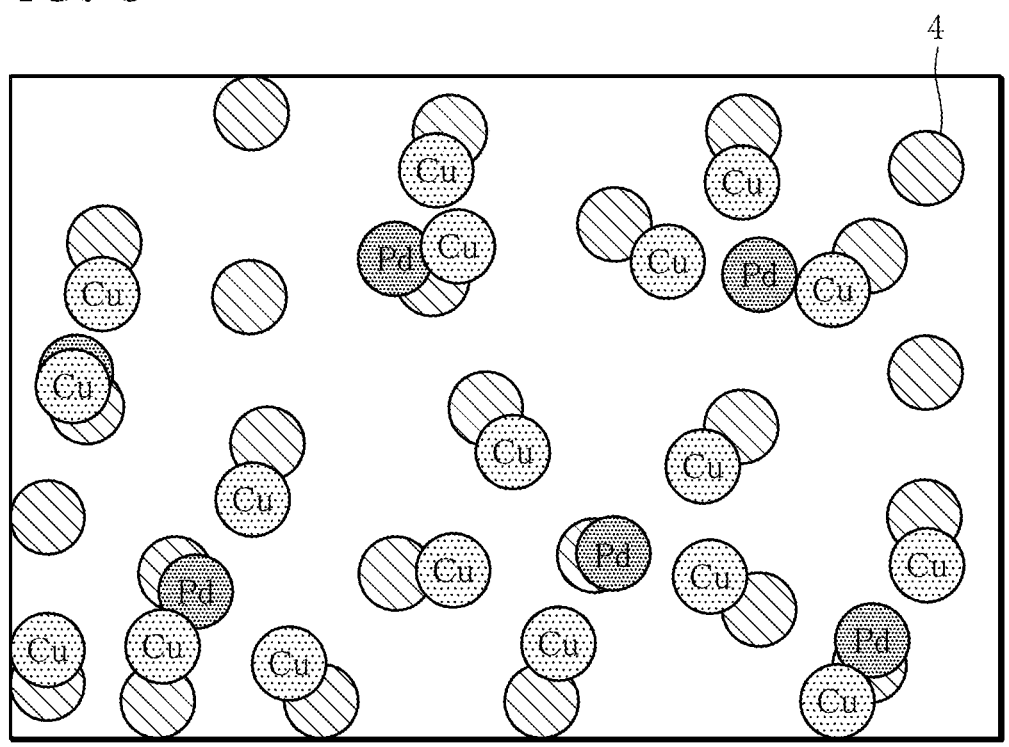
FIG. 8 is a schematic diagram illustrating a state during metal film formation with respect to the three-dimensional wiring board according to the example of the present invention.
Figure 9:
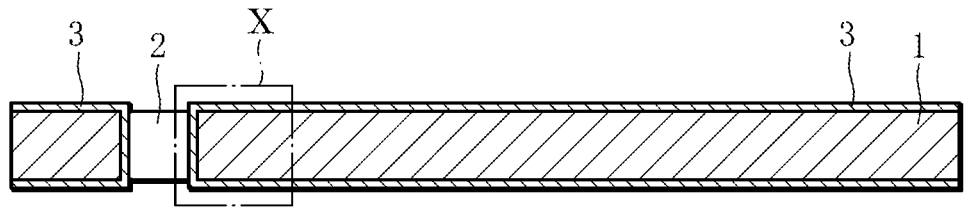
FIG. 9 is a cross-sectional view illustrating a state during a process for producing the three-dimensional wiring board according to the example of the present invention.
Figure 10:
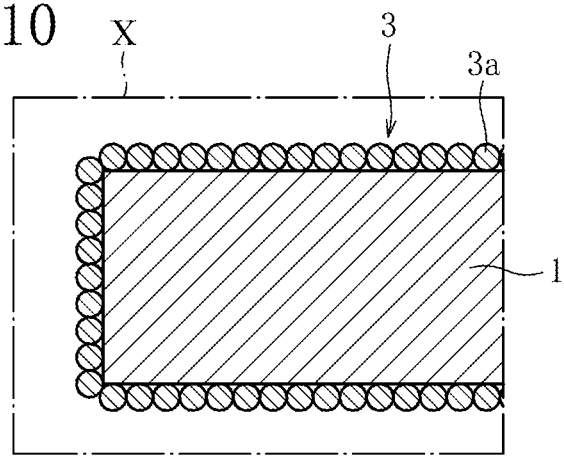
FIG. 10 is an enlarged conceptual diagram of a dashed-line region X in FIG. 9.
Figure 18:
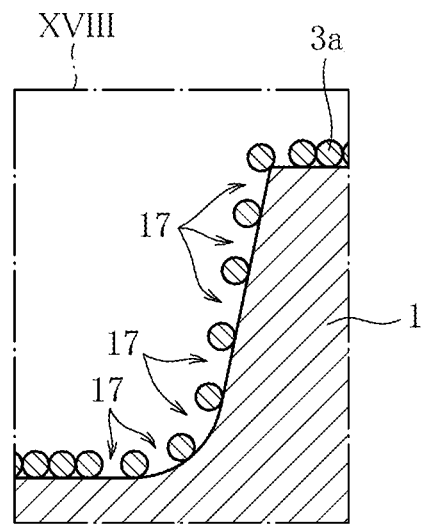
FIG. 18 is an enlarged conceptual diagram of a dashed-line region XVIII in FIG. 17.
Figure 19:
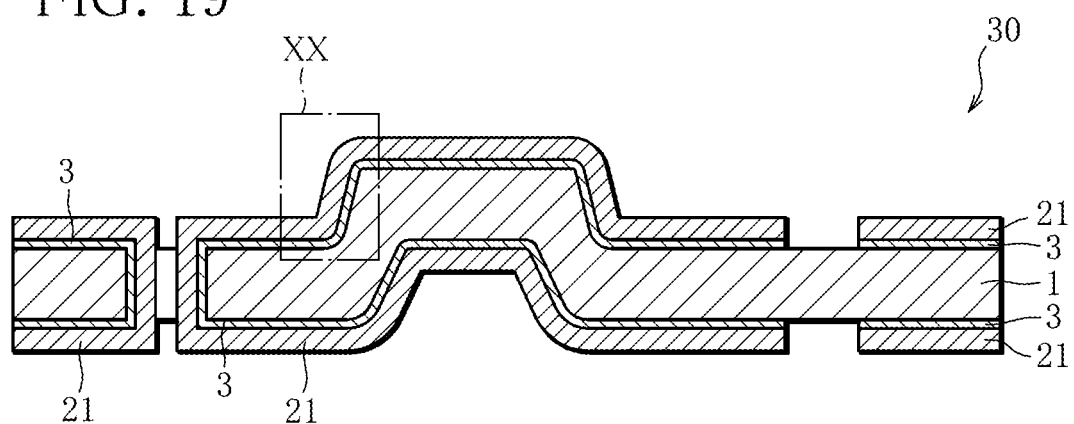
FIG. 19 is a cross-sectional view illustrating a state during a process for producing the three-dimensional wiring board according to the example of the present invention.
Figure 20:
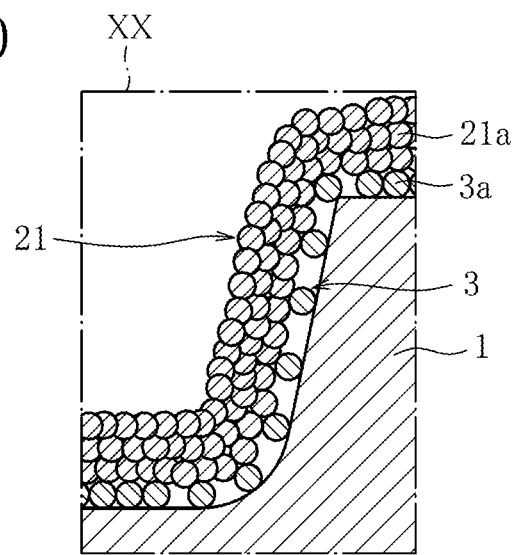
FIG. 20 is an enlarged conceptual diagram of a dashed-line region XX in FIG. 19.

Hereunder, a three-dimensional wiring board production method according to an example of the present invention is described in detail referring to FIG. 1 to FIG. 22. FIG. 1, FIG. 2, FIG. 4, FIG. 9, FIG. 12, FIG. 17 and FIG. 19 are cross-sectional views illustrating states during a process of producing a three-dimensional wiring board. FIG. 5 is an enlarged conceptual diagram of a dashed-line region V in FIG. 4. FIG. 10 is an enlarged conceptual diagram of a dashed-line region X in FIG. 9. FIG. 18 is an enlarged conceptual diagram of a dashed-line region XVIII in FIG. 17. FIG. 20 is an enlarged conceptual diagram of a dashed-line region XX in FIG. 19. In addition, FIG. 13 to FIG. 16 are schematic diagrams illustrating a production process relating to three-dimensional molding according to an example of the present invention. Further, FIG. 3, FIG. 6 to FIG. 8, FIG. 11 and FIG. 21 are schematic diagrams illustrating states during metal film formation with respect to a three-dimensional wiring board according to an example of the present invention. FIG. 22 is a perspective view of a three-dimensional wiring board according to an example of the present invention.

Figure 1:
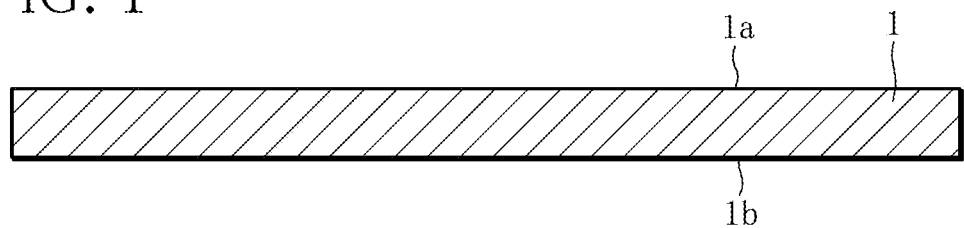
FIG. 1 is a cross-sectional view illustrating a state during a process for producing a three-dimensional wiring board according to an example of the present invention.

First, as illustrated in FIG. 1, a thermoplastic resin film 1 is prepared (preparation step). For example, a known resin film such as a polyimide or polyethylene terephthalate film can be used as the thermoplastic resin film 1. The thickness of the thermoplastic resin film 1 is not limited and can be appropriately changed in accordance with the intended use and required characteristics of the three-dimensional wiring board. For example, in the case of using the three-dimensional wiring board as a single unit, the thickness of the thermoplastic resin film 1 may be adjusted to approximately 100 µm (between 75 µm or more and 150 µm or less), while in the case of using the three-dimensional wiring board together with another retaining member such as a mold resin, the thickness of the thermoplastic resin film 1 may be regulated to 50 µm or less.

Note that, the resin film that is prepared is not limited to a thermoplastic type of resin, and as long as the resin film has a comparatively large breaking elongation, a thermosetting resin film or a composite resin film which has a structure in which a thermosetting resin and a thermoplastic resin are laminated (that is, a thermoplastic resin film and a thermosetting resin film are bonded together) may be used. Here, the term "comparatively large breaking elongation" refers to a value of at least 50% or more, and preferably a value of 150% or more. With respect to the breaking elongation, in a case where necessary characteristics are required in accordance with a three-dimensional shape that is to be molded, and the resin film has a complex and large stepped shape, resin film material having a larger breaking elongation strength is required so that the material can withstand three-dimensional molding.

Figure 2:
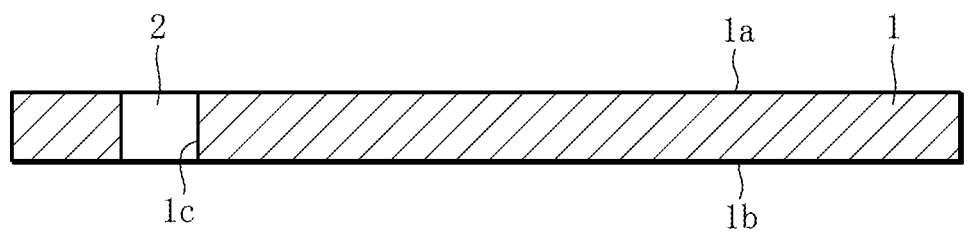
FIG. 2 is a cross-sectional view illustrating a state during a process for producing the three-dimensional wiring board according to the example of the present invention.

Next, as illustrated in FIG. 2, to secure conductivity between the front and rear faces (first face 1a and second face 1b) of the thermoplastic resin film 1, a through-hole 2 is formed using a hole-forming technique such as NC machining, laser machining or a punching process. In the present example, the diameter of the through-hole 2 is made approximately 0.3 mm. Note that, although only one through-hole 2 is illustrated in FIG. 2, the actual three-dimensional wiring board has a plurality of the through-holes 2. Further, the quantity of the through-holes 2 can be changed appropriately in accordance with the circuitry of the three-dimensional wiring board. In addition, positioning holes (for example, with a diameter of 3 mm) to be used for positioning during three-dimensional molding that is described later may be formed at an outer edge portion (that is, a portion that is to be ultimately removed without constituting the three-dimensional wiring board) of the thermoplastic resin film 1.

Next, a first metal film 3 is formed on the surface of the thermoplastic resin film 1 (first metal film formation step) so as to cover the first face 1a and second face 1b of the thermoplastic resin film 1 as well as a side face 1c of the thermoplastic resin film 1 that is exposed by the through-hole. In the present example, metal is metallized on the surface of the thermoplastic resin film 1 by electroless plating utilizing a known molecular bonding technique.

More specifically, first, as a pretreatment, Argon plasma treatment is performed on the thermoplastic resin film 1 to remove a fragile layer of the surface of the thermoplastic resin film 1 and form functional groups having good affinity for a molecular bonding agent, described later, on the surface of the thermoplastic resin film 1. Thereafter, the thermoplastic resin film 1 that underwent the Argon plasma treatment is immersed in a liquid solution of a molecular bonding agent 4 (FIG. 3). In this case, because the molecular bonding agent 4 has a functional groups (first functional groups) that react with the thermoplastic resin film 1, the functional groups of the thermoplastic resin film 1 and the functional groups of the molecular bonding agent 4 join together and, as illustrated in FIG. 4 and FIG. 5, a state is obtained in which the molecular bonding agent 4 is bonded onto the surface of the thermoplastic resin film 1. Note that, although in FIG. 4 the molecular bonding agent 4 is illustrated in a layered state from the viewpoint of illustrating the molecular bonding agent 4 in an easily comprehensible manner, in practice the molecular bonding agent 4 is present in a nano-level state (the thickness of the molecular bonding agent 4 is several nm) as shown in FIG. 5, and is extremely thin in comparison to the other material. Hence, the molecular bonding agent 4 is sometimes omitted from the drawings from FIG. 9 onwards. Further, straight lines that extend vertically from the molecular bonding agent 4 in FIG. 5 represent functional groups. More specifically, straight lines that extend towards the thermoplastic resin film 1 represent functional groups of the molecular bonding agent 4 that are in a state in which the functional groups are joined together with functional groups of the thermoplastic resin film 1, and straight lines that extend on the opposite side to the side of the thermoplastic resin film 1 represent functional groups of the molecular bonding agent 4 that react with a metal of the first metal film 3.

Figure 6:
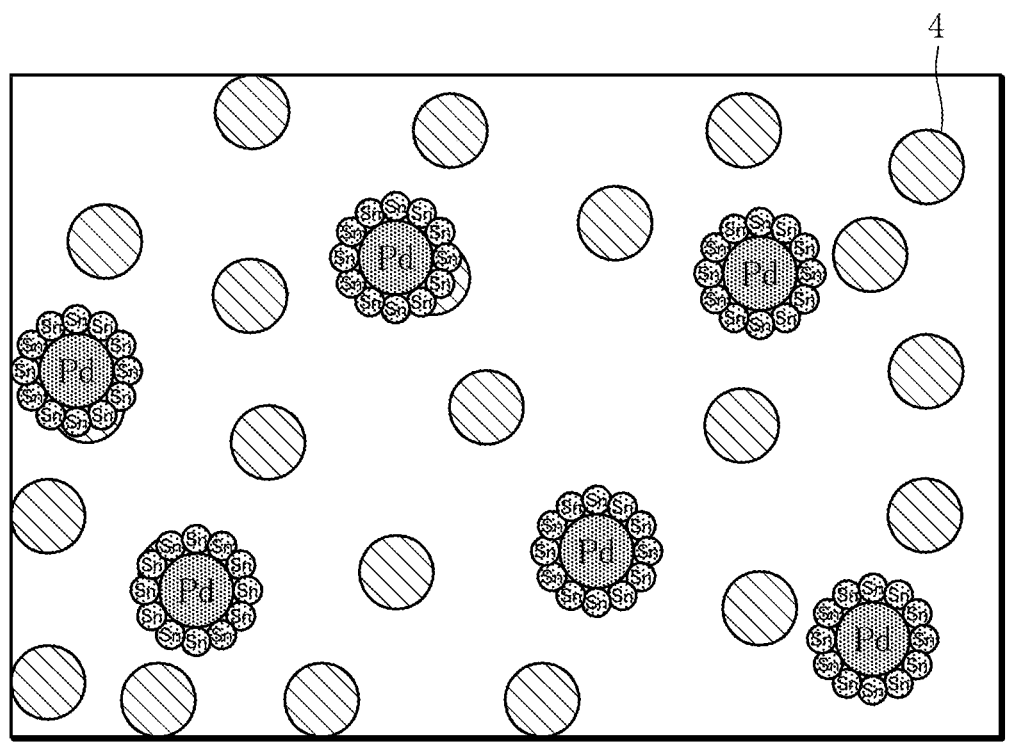
FIG. 6 is a schematic diagram illustrating a state during metal film formation with respect to the three-dimensional wiring board according to the example of the present invention.
Figure 7:
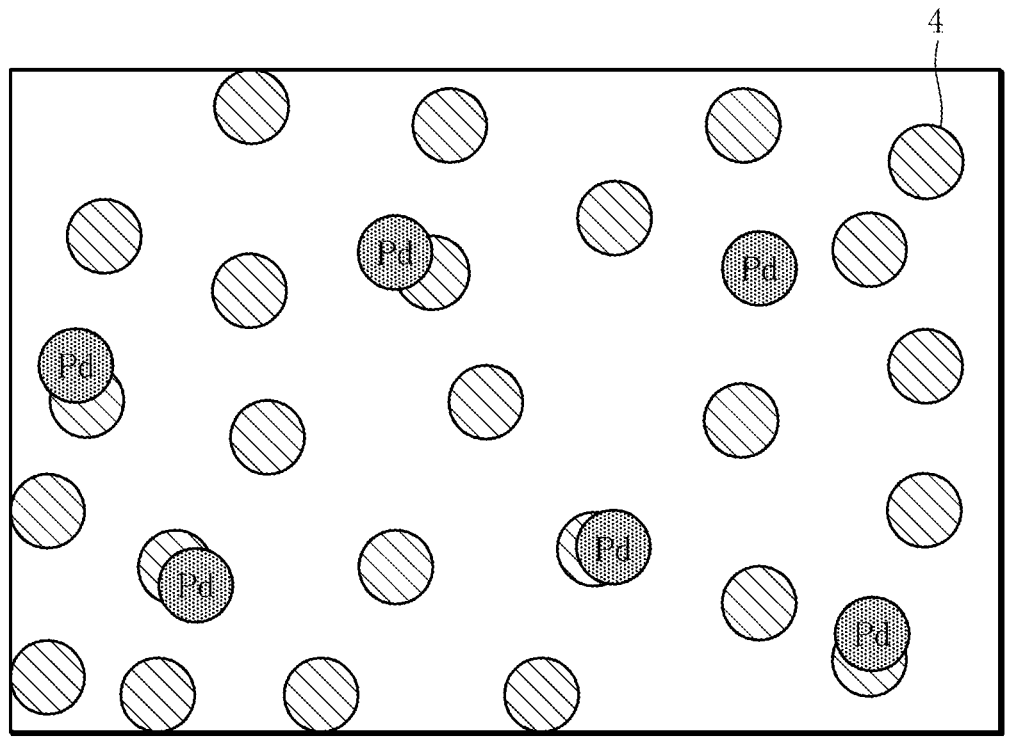
FIG. 7 is a schematic diagram illustrating a state during metal film formation with respect to the three-dimensional wiring board according to the example of the present invention.

Next, after being subjected to the molecular bonding process, the thermoplastic resin film 1 is immersed in a catalyst solution (Sn—Pd colloid aqueous solution) (FIG. 6). In this case, the Sn—Pd colloids are electrically adsorbed on the surface of the thermoplastic resin film 1. Thereafter, when the thermoplastic resin film 1 that is in a state in which Sn—Pd colloids are supported on the surface thereof is impregnated with an accelerator solution, the Sn that had been covering the circumference of the Pd is removed, and the Pd ions change to metallic Pd (FIG. 7). That is, a catalytic treatment is performed to cause the thermoplastic resin film 1 to carry a catalyst (for example Pd). Note that sulfuric acid (concentration of 10%) containing oxalic acid (around 0.1%) can be used as the accelerator solution. Thereafter, the thermoplastic resin film 1 carrying the Pd as a catalyst is immersed for five minutes in an electroless plating bath. By means of the aforementioned immersion, for example copper is deposited using Pd as a catalyst, and the deposited copper bonds with the molecular bonding agent 4 (FIG. 8). In this case, because the molecular bonding agent 4 also has functional groups (second functional groups) that react with the metal of the first metal film 3, utilizing the catalyst, the metal chemically bonds to the ends (second functional groups) of the molecular bonding agent 4 that are positioned on the opposite side to the ends that are bonded to the thermoplastic resin film 1. Next, the thermoplastic resin film 1 is subjected to a heating treatment at 150° C. for 10 minutes to conclude the chemical bonding between the molecular bonding agent 4 and the metal, and thereby complete formation of the first metal film 3 (that is, molecular bonding between the thermoplastic resin film 1 and the first metal film 3) so as to cover the surface of the thermoplastic resin film 1 as illustrated in FIG. 9.

The aforementioned molecular bonding agent 4 is a chemical substance for chemically bonding resin and metal or the like, and is a substance in which a functional group that bonds with resin and a functional group that bonds with metal are present in a single molecular structure. Further, the term "molecular bonding technique" refers to a technique that chemically bonds resin and metal using the molecular bonding agent 4 that has the aforementioned structure. The molecular bonding agent and the molecular bonding technique are described in more detail in the description of Japanese Patent No. 4936344, the description of Japanese Patent No. 5729852, and the description of Japanese Patent No. 5083926.

In the present example, copper is used as the metal of the first metal film 3, and as illustrated in FIG. 10, in the electroless plating the first metal film 3 is formed in a porous state by particles 3a of the copper that is generated in a particle state. Here, the term "porous state" refers to a state in which, although the first metal film 3 does not have a film thickness that is formed completely over the resin film, the film overall is conductive as a result of at least some of the particles coming in contact with each other even though not all of the particles contact with other particles (electrical conduction is not necessarily needed, and even if particles are separated by an inter-particle distance in three-dimensional molding, it is sufficient as long as conduction is ensured by a second metal film that is described later). To paraphrase the foregoing description, in the present example, copper is deposited in a particle state with the particles having a size between 0.02 μm and 0.20 μm to form the first metal film 3 that has a film thickness which can transmit light. The reason for regulating the state (that is, the film thickness) of the first metal film 3 in this manner is that if the first metal film 3 is formed in a complete film state which does not transmit light, if fissures arise in the first metal film 3 at the time of three-dimensional molding that is described later, it will be difficult to repair the fissures by means of a second metal film that is described later. More specifically, if the first metal film 3 is thinner than 0.02 μm, contact points between the resin and copper will decrease and the adherence will be reduced, and the inter-particle distance after being stretched will be too long and repairing conductivity by means of the second metal film that is described later will be difficult. Further, in a case where the first metal film 3 is stretched in a state in which the first metal film 3 transmits light, the fissures are small since only the spaces between the particles are empty. However if the metal film (the first metal film 3) is stretched beyond the limit in a complete film state that does not transmit light, fissures will arise in the metal film and will become cracks that have a wide width. Note that, although only one particle 3a is present in the film thickness direction of the first metal film 3 in the illustration in FIG. 10, as long as the first metal film 3 is in a porous state, a plurality of the particles 3a may be stacked in the film thickness direction.

Figure 11:
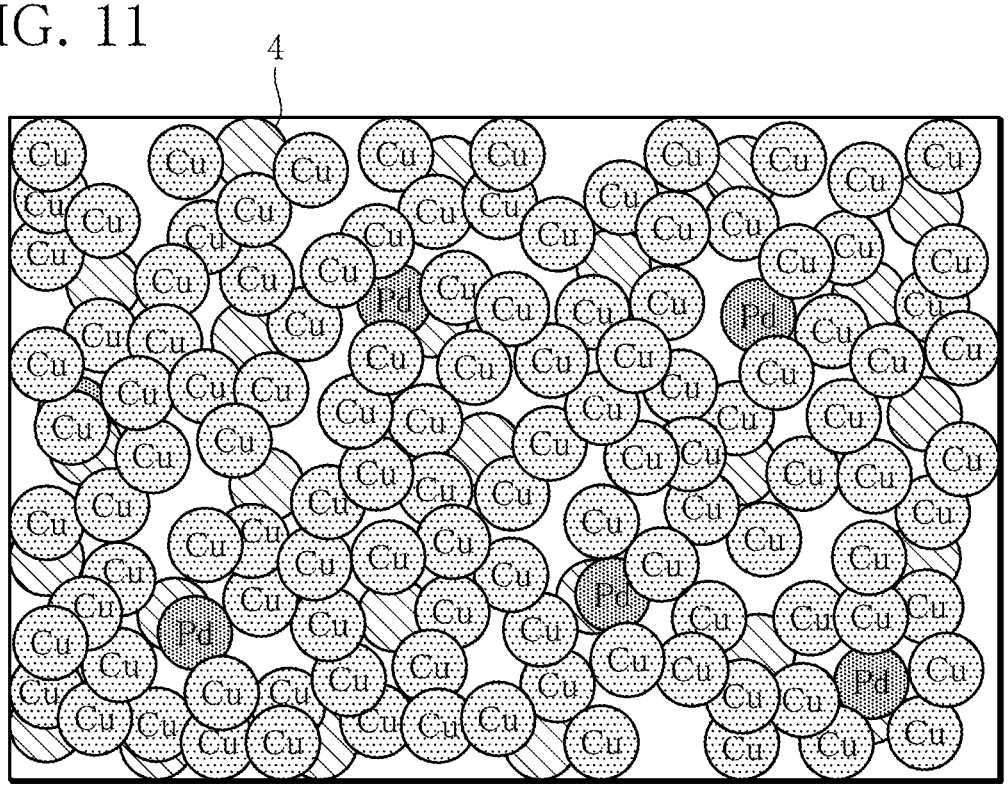
FIG. 11 is a schematic diagram illustrating a state during metal film formation with respect to the three-dimensional wiring board according to the example of the present invention.

The process of forming the first metal film 3 in a porous state is described in more detail hereunder. When deposition of copper continues further from the state in which deposition of copper started that is illustrated in FIG. 8, the newly deposited copper chemically bonds with the molecular bonding agent 4 or with copper that already deposited and reacted with the molecular bonding agent 4. At such time, because the activity of Pd as a catalyst is higher, although generation of the copper proceeds in the planar direction (that is, the direction in which the surface of the thermoplastic resin film 1 extends) by autocatalysis of copper, generation of copper also begins to proceed in the thickness direction (that is, the thickness direction of the first metal film 3). Further, when the autocatalysis of copper starts, copper is sequentially deposited and metallic bonding between copper molecules proceeds, and thus the growth of copper proceeds in the thickness direction and the film thickness thereby increases. In this state, as illustrated in FIG. 11, although there are void portions at which copper is not present and portions at which electrical conduction is not obtained partially exist, because electrical connection paths are present, electrical conduction is obtained with respect to the overall metal film that is formed. As described above, such a state is referred to as a "porous state" in the present example. Further, in the first metal film 3 that is in such a porous state, even if the breaking elongation rate of copper is exceeded, the distances between copper molecules merely increase by a certain extent in parts of the first metal film 3 without large cracks arising.

Further, in the present example, because the thermoplastic resin film 1 and the first metal film 3 chemically bond through the molecular bonding agent 4, both members can be firmly joined together while making the interface between the thermoplastic resin film 1 and the first metal film 3 smooth. Consequently, it is no longer necessary to form concavities and convexities on the surface of the thermoplastic resin film 1, and it is possible to simplify the production process and reduce the production cost and also increase the fineness of a wiring circuit that is formed. Note that the molecular bonding agent that is used is not limited to a single kind. For example, the molecular bonding agent may be a chemical compound that is formed by mixing the molecular bonding agent 4 and another molecular bonding agent having functional groups that react with the molecular bonding agent 4 and the first metal film 3, and can be appropriately changed according to the material of the thermoplastic resin film 1 and the first metal film 3.

Further, the material of the first metal film 3 is not limited to copper. For example, although various metals such as silver, gold or nickel, or an alloy including at least any one of these metals and copper, or a material obtained by laminating respective metals may also be used, preferably a metal that is comparatively soft and has a high degree of breaking elongation strength is used. In this respect, since a film thickness for realizing a state that transmits light and is conductive will differ depending on the metal that is used, in the case of using a different metal, the film thickness is appropriately adjusted so that the first metal film 3 can be formed in a porous state.

In addition, the method for forming the first metal film 3 is not limited to the aforementioned method using a molecular bonding technique, and for example a film deposition technique such as sputtering, vapor deposition, or wet plating that is other than a method using molecular bonding may be used as long as the first metal film 3 can be formed in a porous state. Further, with respect to formation of the first metal film 3, the optimal film deposition technique may be selected in accordance with the metal material to be used.

Note that, although in the present example the first metal film 3 is formed so as to cover the first face 1a and the second face 1b of the thermoplastic resin film 1 as well as the side face 1c of the thermoplastic resin film 1 that is exposed by a through-hole, depending on the required structure and characteristics of the three-dimensional wiring board, the first metal film 3 may be formed on only either one of the first face 1a and the second face 1b of the thermoplastic resin film 1. That is, a three-dimensional wiring board on which a wiring pattern is formed on only one side is also included as a three-dimensional wiring board according to the present invention, and not just a three-dimensional wiring board on which a wiring pattern is formed on both sides.

Figure 12:
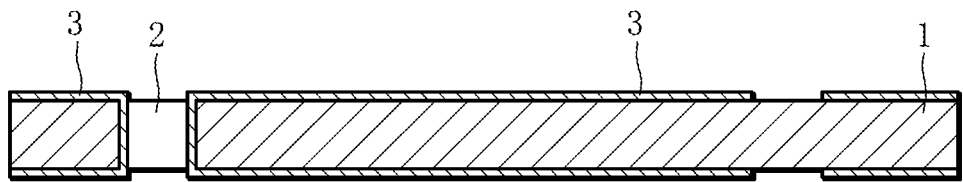
FIG. 12 is a cross-sectional view illustrating a state during a process for producing the three-dimensional wiring board according to the example of the present invention.

Next, as illustrated in FIG. 12, a patterning process in performed on the first metal film 3 by photolithography to thereby form a desired wiring pattern (pattern formation step). Specifically, a resist film is bonded by thermocompression bonding to the surface of the thermoplastic resin film 1 in a state in which the first metal film 3 is formed thereon, and exposure and development are performed using a mask film on which a predetermined pattern is printed. Subsequently, the first metal film 3 is subjected to etching using the developed resist film as an etching mask, thereby forming a desired wiring pattern. Thereafter, the resist film is detached and removed. Here, in consideration of stretching and deformation of the first metal film 3 caused by three-dimensional molding that is described later, it is preferable to adjust the shape of the wiring pattern (line width, wiring length, wiring interval and the like) in advance.

Because patterning is performed on the first metal film 3 by photolithography in this manner, a pattern with a higher definition can be realized in comparison to pattern formation using an inkjet printing technique or a gravure offset printing technique. That is, the resolution of the first metal film 3 is higher than that of a wiring pattern that is patterned using an inkjet printing technique or a gravure offset printing technique or the like (that is, high-definition wiring formation is realized that has excellent linearity).

Figure 13:
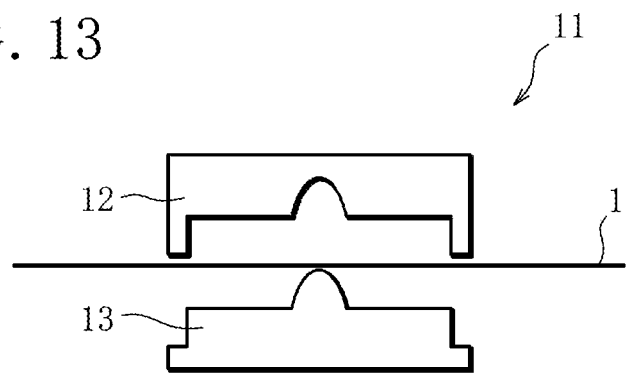
FIG. 13 is a schematic diagram illustrating a production process relating to three-dimensional molding according to the example of the present invention.
Figure 14:
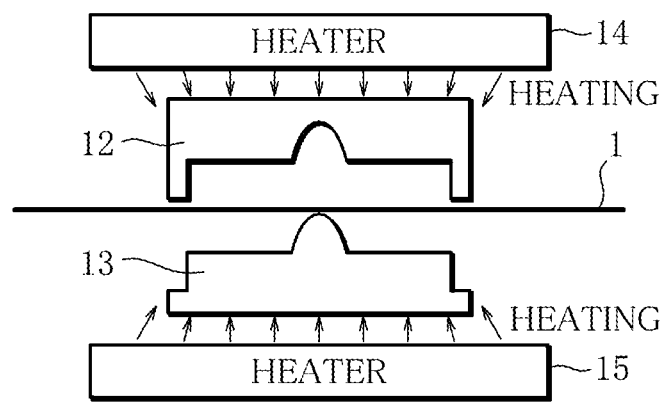
FIG. 14 is a schematic diagram illustrating a production process relating to three-dimensional molding according to the example of the present invention.

Next, a heat treatment and pressurization treatment are performed on the thermoplastic resin film 1 in a state in which the first metal film 3 is formed thereon to thereby perform three-dimensional molding (three-dimensional molding step). As a specific three-dimensional molding step, first, positioning of the thermoplastic resin film 1 with respect to a casting mold 11 is performed using the aforementioned positioning holes. This is done to align the molding position and the wiring pattern position. That is, as illustrated in FIG. 13, the thermoplastic resin film 1 is disposed between an upper mold 12 and a lower mold 13 of the mold 11. Next, as illustrated in FIG. 14, the upper mold 12 is heated by an upper heating apparatus 14, and the lower mold 13 is heated by a lower heating apparatus 15. At this time, the heating temperature can be regulated within a range of 270 to 350° C. (for example, 300° C.) that is higher than the glass transition temperature of the material in the present example because a polyimide film is used as the thermoplastic resin film 1, and the heating temperature is appropriately regulated according to the material of the thermoplastic resin film 1. In this case, although it is necessary for the heating temperature to be equal to or higher than the relevant glass transition temperature and to be less than or equal to the heat-resistant temperature of the thermoplastic resin film 1, the heating temperature is preferably set to as low a temperature as possible within the relevant range. This is done to lessen a reduction in adherence between the thermoplastic resin film 1 and the first metal film 3 formed on the thermoplastic resin film 1 that is caused by the heating.

Figure 15:
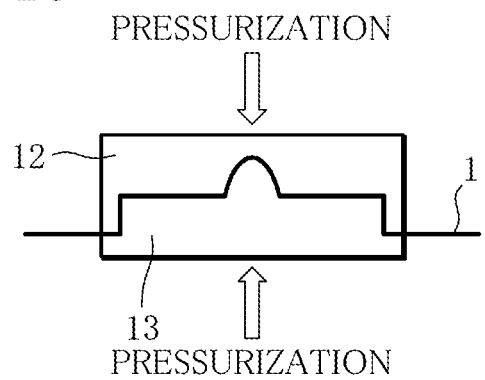
FIG. 15 is a schematic diagram illustrating a production process relating to three-dimensional molding according to the example of the present invention.
Figure 16:
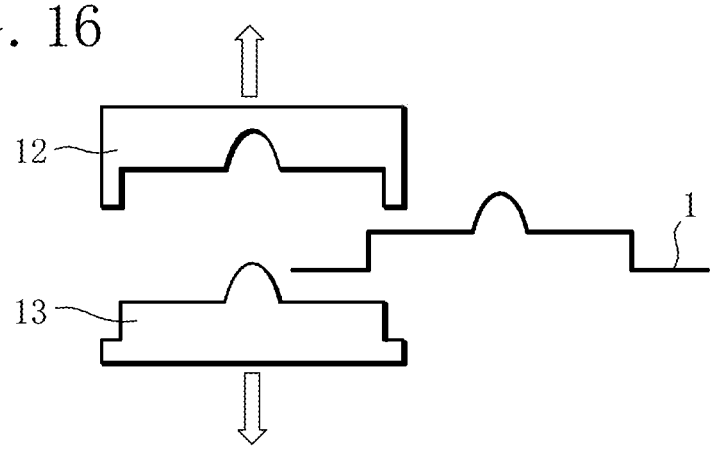
FIG. 16 is a schematic diagram illustrating a production process relating to three-dimensional molding according to the example of the present invention.

While performing the heat treatment, the upper mold 12 and the lower mold 13 are brought close to each other to perform a pressing process using a desired pressure (for example, 10 MPa) from above and below on the thermoplastic resin film 1 (FIG. 15). Note that the desired pressure is appropriately adjusted in consideration of the material of the thermoplastic resin film 1 and the fact that it will be difficult to perform the desired three-dimensional molding if the pressure is too weak. After the pressing process ends, the thermoplastic resin film 1 is taken out from the mold 11 (FIG. 16), thereby completing the three-dimensional molding of the thermoplastic resin film 1. In other words, the formation of a substrate for a three-dimensional wiring board 16 is completed. Note that illustration of the first metal film 3 is omitted in the drawings from FIG. 13 to FIG. 16. Further, although also depending on the three-dimensional shape that is required, because a plurality of concavities and convexities are formed in the shape of the actual three-dimensional wiring board, a structure having a plurality of concavities and convexities may also be adopted for the mold 11, in which the plurality of concavities and plurality of convexities of the upper mold 12 and the lower mold 13 fit together.

Figure 17:
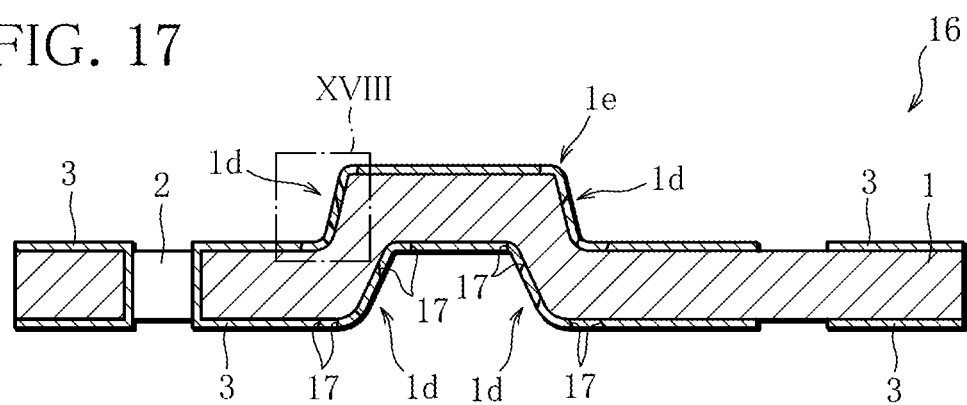
FIG. 17 is a cross-sectional view illustrating a state during a process for producing the three-dimensional wiring board according to the example of the present invention.

As illustrated in FIG. 17, in the thermoplastic resin film 1 after completion of the three-dimensional molding (that is, the substrate for a three-dimensional wiring board 16), fissures 17 are liable to arise at bent portions 1d that are bent by the three-dimensional molding. In this case, as illustrated in FIG. 18, the fissures 17 are gaps that arise due to expansion of an inter-particle distance between the particles 3a of the copper constituting the first metal film 3, and the structure of the fissures 17 differs from the structure of fissures that arise due to a metal film being stretched in a complete metal film shape that does not transmit light. Note that, depending on the deposition state of the first metal film 3 and the three-dimensional shape obtained by three-dimensional molding, the fissures do not arise in some cases. Further, as illustrated in FIG. 18, although the inter-particle distance in the first metal film 3 widens in accordance with stretching of the thermoplastic resin film 1, because the first metal film 3 is formed in a porous state, the depth of the fissures 17 is equal to the dimensions of the particles 3a and is thus extremely small, and in addition, the width of the fissures 17 is also small in comparison to a case where the first metal film 3 is formed in a complete film state. That is, the substrate for a three-dimensional wiring board 16 according to the present example is in a state that enables easier repair of the fissures 17 in comparison to a case where the first metal film 3 is formed in a complete film state. In other words, although in a case where the first metal film 3 is stretched in a state in which the first metal film 3 transmits light, the fissures 17 (gaps between particles) are small since the spaces between particles are merely empty, in a metal film that is stretched beyond the limit in a complete film state that does not transmit light, fissures arise and cracks which have a wide width are generated.

Further, as a method for reducing the occurrence of the fissures 17 at the bent portion 1d, the above described three-dimensional molding may be performed in a state in which the thermoplastic resin film 1 is interposed between two protective films. By this means, the shape of angular parts 1e of the bent portions 1d can be smoothened to a certain extent and the occurrence of the fissures 17 can be suppressed. In this case, the protective films are preferably formed of the same material as the thermoplastic resin film 1. In addition, as a method for reducing the occurrence of the fissures 17 at the bent portions 1d, the mold 11 may be designed so as to cause the shape of the angular parts 1e of the bent portions 1d to curve, or so as to make the angle of the angular parts 1e less than 90 degrees (for example, 75 to 85 degrees).

Note that, although in the present example a pressing process is performed on the thermoplastic resin film 1 from above and below using the upper mold 12 and the lower mold 13, another pressing method such as vacuum pressing or air-pressure pressing may be used as long as uniformity of the thickness of the thermoplastic resin film 1 after heat-pressing can be ensured.

Next, a second metal film 21 is formed so as to cover the surface of the first metal film 3 of the substrate for a three-dimensional wiring board 16 (second metal film formation step: FIG. 19). In the present example, metal is additionally deposited on the surface of the first metal film 3 by common electroless plating.

Specifically, in the second metal film formation step, first, in order to remove an oxidized layer that was formed on the surface of the substrate for a three-dimensional wiring board 16 by heating in the molding step, the substrate for a three-dimensional wiring board 16 is immersed in a desired cleaning solution (for example, an acid-degreasing solution or sulfuric acid solution). Next, a catalytic treatment is performed to cause a catalyst (for example, a Pd catalyst) of a type that replaces the first metal film 3 to react with the first metal film 3 of the substrate for a three-dimensional wiring board 16, and thereafter the substrate for a three-dimensional wiring board 16 is immersed in an electroless plating solution. Subsequently, metal is selectively deposited at only a region surrounding the first metal film 3 that has the catalyst present on the surface thereof, and metal is not deposited at regions which do not form a wiring circuit (that is, exposed regions of the thermoplastic resin film 1) and at which additional patterning of the second metal film 21 is not required.

Figure 21:
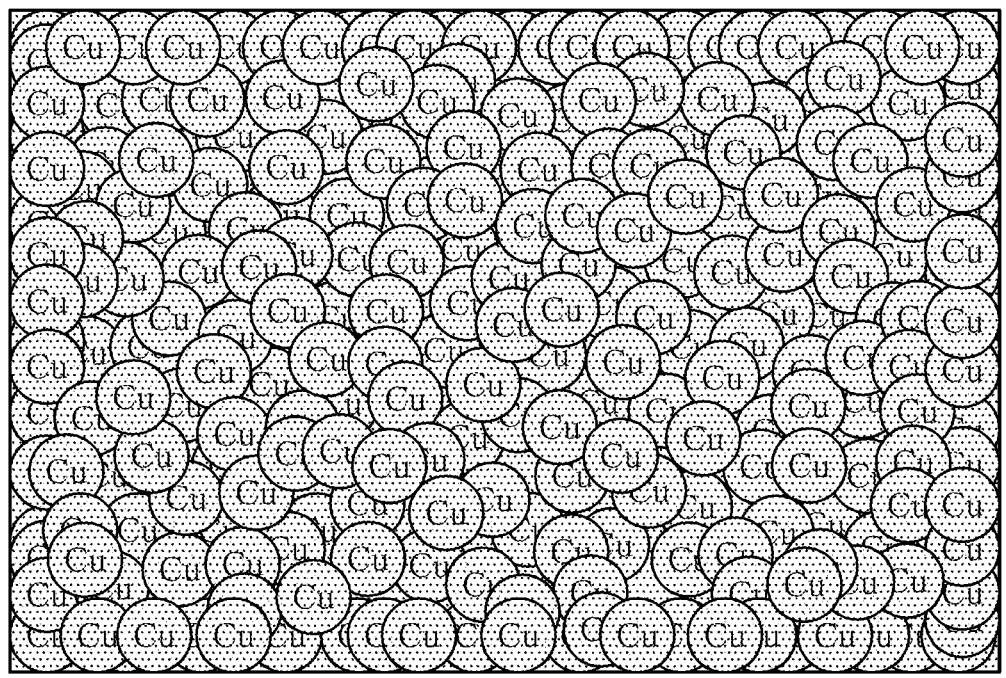
FIG. 21 is a schematic diagram illustrating a state during metal film formation with respect to the three-dimensional wiring board according to the example of the present invention.
Figure 22:
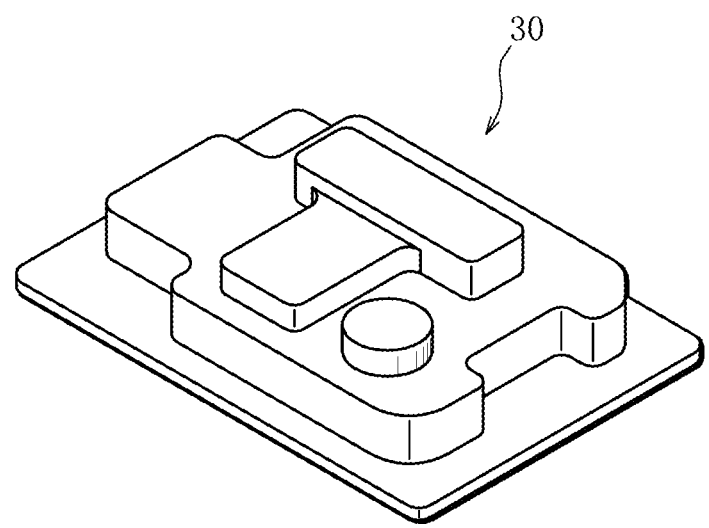
FIG. 22 is a perspective view of the three-dimensional wiring board according to the example of the present invention.

In the present example, copper is used as the metal of the second metal film 21, and as will be understood from FIG. 20 and FIG. 21, a plurality of particles 21a of copper are deposited on the particles 3a of the first metal film 3. In this case, the second metal film 21 is formed in a complete film state, and not a porous state. In particular, in the present example, the second metal film 21 having a thickness of 5 μm or more can be formed by immersion for one hour. Further, in the present example, the particles 21a constituting the second metal film 21 grow around the particles 3a constituting the first metal film 3, and grow to the same extent in both the thickness direction of the second metal film 21 and a direction that is orthogonal to the thickness direction (planar direction of the second metal film 21). By this means, the second metal film 21 can be formed so as to repair the fissures 17 in the first metal film 3 that are generated by the three-dimensional molding. That is, by forming the second metal film 21, conduction failures caused by the fissures 17 are repaired and a wiring circuit (conductor layer consisting of the first metal film 3 and the second metal film 21) can be formed. In this case, since repairing of the fissure 17 by the second metal film 21 can repair a width of the fissure 17 that is of the order of twice the film thickness of the second metal film 21, the film thickness of the second metal film 21 may be regulated to a thickness that is equal to or greater than one-half of the assumed maximum width of the fissure 17, and more preferably may be regulated to a film thickness that is equal to the width of the fissure 17. Further, the second metal film 21 is generated in a similar manner to the surface layer on a side wall 1c of a through-hole 2 also, and even if a conduction failure exists between the front and rear faces that is caused by the through-hole 2, it is thereby possible to repair the failure and restore conduction.

In addition, in the present example, although the thickness of the conductor layer (wiring pattern thickness) that is necessary as a wiring circuit is insufficient when only the film thickness of the first metal film 3 is present, the necessary thickness of the conductor layer can be secured by forming the second metal film 21.

Note that, although in the present example the second metal film 21 is formed by electroless plating, as long as the second metal film 21 can ultimately be formed only on the surface of the first metal film 3, another film deposition technique (for example, electroplating or coating of conductive ink) may be used. However, although in the case of forming the second metal film 21 by electroless plating as in the present example it is possible to form independent wiring, that is, a wiring circuit that is electrically isolated from the outer circumferential portion of the molded body, in the case of forming the second metal film 21 by electroplating it is necessary for all of the wiring to be electrically conductive with the outer circumferential portion of the molded body, and hence it is necessary to take this into consideration including the arrangement of the power feeder lines during the design stage. Further, in this case, if a non-conducting portion arises as a result of performing three-dimensional molding, it will not be possible to form the second metal film 21 because electricity will not flow further then the non-conducting portion.

Note that the material of the second metal film 21 is not limited to copper, and another metal such as nickel, nickel-chromium, nickel-copper, gold or silver or alloys which include these metals may be used, and the material can be appropriately adjusted in accordance with the characteristics and reliability that are required of the three-dimensional wiring board.

After the above described production process is performed, the surface of the second metal film 21 is subjected a rust prevention treatment to thereby complete production of a three-dimensional wiring board 30 that is constituted by the thermoplastic resin film 1, the first metal film 3 and the second metal film 21. Note that a protective film made of solder resist may also be formed at required portions on the surface of the three-dimensional wiring board 30. In this case, a method is conceivable in which the solder resist is applied onto required portions by an inkjet method that uses an inkjet device.

As will be understood from FIG. 19 to FIG. 21, in the three-dimensional wiring board 30 according to the present example, fissures that arise in the first metal film 3 that is formed in a porous state on the surface of the thermoplastic resin film 1 are surely repaired by the second metal film 21 that is formed having a film thickness that is thicker than the thickness of the first metal film 3, and thus the three-dimensional wiring board 30 is a wiring board which prevents disconnection of wires in a wiring circuit and has excellent reliability. Further, in comparison to an MID substrate, a fine wiring pattern (for example, L/S=30/30 µm) can be realized more easily by the above described production method, and miniaturization and lower costs are also realized by the above described production method.

Furthermore, as illustrated in FIG. 22, in the three-dimensional wiring board 30 that is ultimately formed, dimensions in the z-direction (that is, a height dimension) differ at positions in the x-direction and y-direction, respectively, and concavities and convexities are formed on the x-y plane. Note that FIG. 22 is a schematic drawing for describing the three-dimensional shape of the three-dimensional wiring board 30, and a wiring pattern and a through-hole are omitted from the illustration in FIG. 22.

Figure 23:
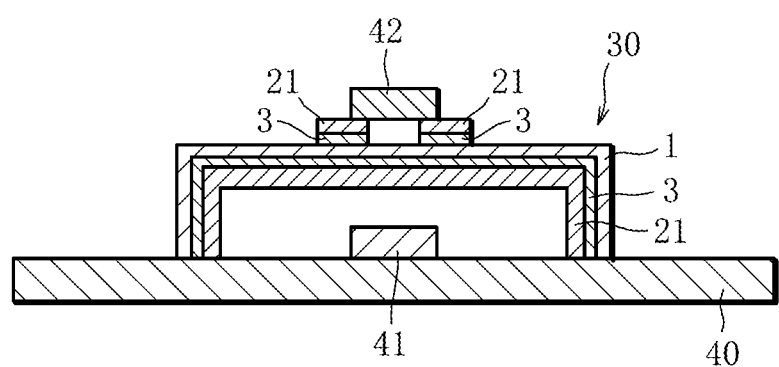
FIG. 23 is a schematic diagram illustrating a usage example of the three-dimensional wiring board according to the example of the present invention.

In addition, because the three-dimensional wiring board 30 according to the present example has a conductor layer constituted by the first metal film 3 and the second metal film 21 on the surface (first face 1a and second face 1b) of the thermoplastic resin film 1, and also has a three-dimensional shape, the three-dimensional wiring board 30 can be applied to various uses. For example, if the thermoplastic resin film 1 is made comparatively thick (for example, 100 µm), as illustrated in FIG. 23, it is possible to mount another electronic component 42 on the surface of the thermoplastic resin film 1 while achieving electromagnetic shielding with respect to an electronic component 41 that is mounted on another mounting board 40. In this case, since electromagnetic shielding is achieved by means of the conductor layer (the first metal film 3 and the second metal film 21) located on the electronic component 41 side (that is, the inner side), patterning is not performed on the conductor layer that is located on the inner side (that is, a solid pattern is formed). Further, the three-dimensional wiring board 30 is adhered to the mounting board 40 using a bonding member such as a solder or an electroconductive adhesive. Note that, by replacing the conductor layer that is patterned with a conductor layer that is not patterned, a configuration may be adopted in which the electronic component 42 is disposed in a space that is shielded by the three-dimensional wiring board 30 and the mounting board 40, and electromagnetic shielding is achieved with respect to the electronic component 41 and the electronic component 42.

In addition, the conductor layer on which patterning has not been performed may be grounded and caused to function as a GND layer, and an independent characteristic impedance control pattern or a differential impedance control pattern may be formed on the conductor layer located on an opposite side to the conductor layer on which patterning has not been performed. Due to this structure, impedance control can be achieved in the three-dimensional wiring board 30.

Further, in a case where the thermoplastic resin film 1 is made comparatively thin (for example, 50 µm or less), the three-dimensional wiring board 30 can be bonded to another mold resin having a three-dimensional shape and can be used as a composite structure that serves as a substitute for a conventional MID substrate. This is because, since the thermoplastic resin film 1 is thin, even if the three-dimensional wiring board 30 is adhesively bonded to another mold resin, the thickness of the composite structure constituted by the three-dimensional wiring board 30 and the other mold resin is not large, and the strength as the composite structure in question can be secured. Further, because a conductor layer is formed on both sides of the thermoplastic resin film 1, a degree of freedom in the design and a narrowing of the external size of the composite structure in question can be easily achieved in comparison to the conventional MID substrate.

Further, by adopting a structure in which a flat thermoplastic resin film joins two portions that were three-dimensionally molded, and forming wiring that links the two portions, a variety of structures and usage methods for a so-called "flex-rigid board" are obtained.

Embodiments of the Present Invention

A three-dimensional wiring board production method according to a first embodiment of the present invention includes: a preparation step of preparing a resin film having a breaking elongation of 50% or more (a film that is actually used is a thermoplastic polyimide material having a thickness of 125 µm that has a breaking elongation of 160 to 170%); a first metal film formation step of forming a first metal film on a surface of the resin film; a pattern formation step of performing patterning on the first metal film by photolithography to form a desired pattern; a three-dimensional molding step of performing three-dimensional molding by heating and pressurizing the resin film; and a second metal film formation step of forming a second metal film on the first metal film having a pattern formed thereon; wherein, in the first metal film formation step, the first metal film is formed in a porous state by depositing a metal in a particle state and regulating a film thickness.

In the first embodiment, because the second metal film is formed using the first metal film on which a pattern is formed, a special apparatus or process or the like is not required to perform patterning on the first metal film and the second metal film, and an existing wiring board production apparatus can be used, and a finer wiring pattern can be realized at a lower cost. Further, because the first metal film and the second metal film are formed on both sides of the resin film, in comparison to a single-sided substrate, the degree of freedom of the wiring circuit is greater and it is also possible to achieve miniaturization more easily. In addition, because the first metal film is formed in a porous state, the occurrence of irreparable fissures in the first metal film can also be prevented in the subsequent three-dimensional molding step. Thus, the three-dimensional wiring board production method of the present invention can achieve fine patterning of a wiring circuit and cost reductions, and can produce a three-dimensional wiring board that prevents disconnection of wires in a wiring circuit and thus has excellent reliability.

A three-dimensional wiring board production method according to a second embodiment of the present invention is in accordance with the aforementioned first embodiment, wherein, in a case where a fissure arises in the first metal film that is located on a bent portion of the resin film that is bent by three-dimensional molding in the three-dimensional molding step, the fissure is repaired by means of the second metal film. By this means, a highly reliable three-dimensional wiring board in which a conduction failure does not arise in a wiring circuit can be produced.

A three-dimensional wiring board production method according to a third embodiment of the present invention is in accordance with the aforementioned second embodiment, wherein, a thickness of the second metal film in the second metal film formation step is made a thickness that is equal to or greater than one-half of a width of the fissure. By this means, a fissure that arises in the first metal film can be surely repaired by the second metal film.

A three-dimensional wiring board production method according to a fourth embodiment of the present invention is in accordance with any one of the above described first to third embodiments, wherein, in the first metal film formation step, copper, silver, nickel or gold, or an alloy including at least any one of copper, silver, nickel and gold is deposited in a particle state at a thickness within a range from 0.02 μm to 0.20 μm. By this means, a fissure that arises in the first metal film can be reduced without impairing the adherence between the resin and metal, and the fissure can be surely repaired by the second metal film.

A three-dimensional wiring board production method according to a fifth embodiment of the present invention is in accordance with any one of the above described first to fourth embodiments, wherein, in the first metal film formation step, the resin film and the first metal film are chemically bonded using a molecular bonding agent. By this means, the resin film and the first metal film can be surely bonded together without forming concavities and convexities in the resin film, and a reduction in the production cost and an increase in the fineness of the wiring pattern can be achieved.

A three-dimensional wiring board production method according to a sixth embodiment of the present invention is in accordance with the above described fifth embodiment, wherein the molecular bonding agent includes a first functional group that reacts with the resin film and a second functional group that reacts with a metal of the first metal film. By this means, the resin film and the first metal film can be bonded together more surely, and a further reduction in the production cost can be achieved.

A three-dimensional wiring board production method according to a seventh embodiment of the present invention is in accordance with any one of the above described first to sixth embodiments, wherein, in the first metal film formation step the first metal film is formed on both sides of the resin film, in the pattern formation step patterning is performed on each of the first metal films that are formed on both sides of the resin film, and in the second metal film formation step the second metal film is formed on each of the first metal films which each have a pattern formed thereon. By this means, a wiring pattern can be formed on both sides of the three-dimensional wiring board, and high densification of the three-dimensional wiring board can be achieved.

A three-dimensional wiring board according to an eighth embodiment of the present invention includes: a resin film having a three-dimensional shape and having a breaking elongation of 50% or more; a first metal film that is formed on a surface of the resin film and that has a desired pattern; and a second metal film that is formed on the first metal film; wherein a film thickness of the first metal film is regulated so that the first metal film is a porous-like structure that is formed by depositing a metal in a particle state.

In the eighth embodiment, because the second metal film is formed using the first metal film having a pattern formed thereon, a special apparatus or process for performing patterning on the first metal film and the second metal film is not required, and a lower cost and finer wiring pattern is realized. Further, because the first metal film and the second metal film are formed on both sides of the resin film, in comparison to a single-sided substrate, the degree of freedom with respect to a wiring circuit is greater and it is possible to easily achieve miniaturization. In addition, because the first metal film is formed in a porous state, even if fissures arise in the first metal film, the fissures are repaired by the second metal film, and thus a wiring circuit having no conduction failures and excellent reliability is realized. Thus, the three-dimensional wiring board of the present invention achieves fine patterning of a wiring circuit and a reduction in cost, and prevents the disconnection of a wire in a wiring circuit and hence has excellent reliability.

A three-dimensional wiring board according to a ninth embodiment of the present invention is in accordance with the above described eighth embodiment, wherein the second metal film repairs a fissure that arises in the first metal film at a bent portion of the resin film. By this means, a conduction failure does not occur in the wiring circuit, and excellent reliability can be realized.

A three-dimensional wiring board according to a tenth embodiment of the present invention is in accordance with the above described ninth embodiment, wherein a thickness of the second metal film is equal to or greater than one-half of a width of the fissure. By this means, a fissure that arises in the first metal film can be surely repaired by the second metal film.

A three-dimensional wiring board according to an eleventh embodiment of the present invention is in accordance with any one of the above described eighth to tenth embodiments, wherein the first metal film has a porous-like structure that is formed by depositing copper in a particle state at a thickness within a range from 0.02 μm to 0.20 μm. By this means, fissures that arise in the first metal film can be made smaller, and can be surely repaired by the second metal film.

A three-dimensional wiring board according to a twelfth embodiment of the present invention is in accordance with any one of the above described eighth to eleventh embodiments, the three-dimensional wiring board including, between the resin film and the first metal film, a molecular bonding agent that chemically bonds the resin film and the first metal film. Therefore, since it is not necessary to form concavities and convexities in the resin film, the production cost can be reduced and the resin film and the first metal film can be firmly bonded together.

A three-dimensional wiring board according to a thirteenth embodiment of the present invention is in accordance with the above described twelfth embodiment, wherein the molecular bonding agent includes a first functional group that reacts with the resin film and a second functional group that reacts with a metal of the first metal film. By this means, the resin film and the first metal film can be bonded together more firmly, and a further reduction in the production cost can be achieved.

A three-dimensional wiring board according to a fourteenth embodiment of the present invention is in accordance with any one of the above described eighth to thirteenth embodiments, wherein the first metal film is formed on both sides of the resin film. By this means, high densification of the three-dimensional wiring board can be achieved.

A substrate for a three-dimensional wiring board according to a fifteenth embodiment of the present invention includes: a resin film having a breaking elongation of 50% or more; and a first metal film that is formed on a surface of the resin film and that has a desired pattern; wherein a film thickness of the first metal film is regulated so that the first metal film is a porous-like structure that is formed by depositing a metal in a particle state.

In the fifteenth embodiment, because the first metal film is formed in a porous state, even if a fissure arises in the first metal film, the fissure can be repaired by deposition of an additional film, and therefore the prevention of conduction failures is ultimately achieved.

A substrate for a three-dimensional wiring board according to a sixteenth embodiment of the present invention is in accordance with the above described fifteenth embodiment, including, between the resin film and the first metal film, a molecular bonding agent that chemically bonds the resin film and the first metal film. By this means, since it is not necessary to form concavities and convexities in the resin film, the production cost can be reduced and the resin film and the first metal film can be firmly bonded together.

A substrate for a three-dimensional wiring board according to a seventeenth embodiment of the present invention is in accordance with the above described fifteenth or sixteenth embodiment, wherein the first metal film is formed on both sides of the resin film. By this means, high densification of the three-dimensional wiring board can be achieved.

EXPLANATION OF REFERENCE SIGNS

1 Thermoplastic Resin Film
1a First Face
1b Second Face
1c Side Face
1d Bent Portion
1d Angular Part
2 Through-Hole
3 First Metal Film
3a Particle
4 Molecular Bonding Agent
11 Mold
12 Upper Mold
13 Lower Mold
14 Upper Heating Apparatus
15 Lower Heating Apparatus
16 Substrate for Three-Dimensional Wiring Board
17 Fissure
21 Second Metal Film
21a Particle
30 Three-Dimensional Wiring Board
40 Mounting Board
41 Electronic Component
42 Electronic Component

The invention claimed is:

1. A three-dimensional wiring board, comprising:
a resin film having a three-dimensional shape and having a breaking elongation of 50% or more;
a first metal film that is formed on a surface of the resin film and that has a desired pattern; and
a second metal film that is formed on the first metal film;
wherein the first metal film has a porous-like structure that is formed by depositing a metal in a particle state, and has a film thickness that can transmit light.

2. The three-dimensional wiring board according to claim 1, wherein the second metal film repairs a fissure that arises in the first metal film at a bent portion of the resin film.

3. The three-dimensional wiring board according to claim 2, wherein a thickness of the second metal film is equal to or greater than one-half of a width of the fissure.

4. The three-dimensional wiring board according to claim 1, wherein the first metal film has a porous-like structure that is formed by depositing copper in a particle state at a thickness within a range from 0.02 μm to 0.20 μm.

5. The three-dimensional wiring board according to claim 1, comprising, between the resin film and the first metal film, a molecular bonding agent that chemically bonds the resin film and the first metal film.

6. The three-dimensional wiring board according to claim 5, wherein the molecular bonding agent comprises a first functional group that reacts with the resin film and a second functional group that reacts with a metal of the first metal film.

7. The three-dimensional wiring board according to claim 1, wherein the first metal film is formed on both sides of the resin film.

8. A substrate for a three-dimensional wiring board, comprising:
a resin film having a breaking elongation of 50% or more; and
a first metal film that is formed on a surface of the resin film and that has a desired pattern;
wherein the first metal film has a porous-like structure that is formed by depositing a metal in a particle state, and has a film thickness that can transmit light.

9. The substrate for a three-dimensional wiring board according to claim 8, comprising, between the resin film and the first metal film, a molecular bonding agent that chemically bonds the resin film and the first metal film.

10. The substrate for a three-dimensional wiring board according to claim 8, wherein the first metal film is formed on both sides of the resin film.

* * * * *